(12) United States Patent
Ba-Tis et al.

(10) Patent No.: US 9,813,602 B2
(45) Date of Patent: *Nov. 7, 2017

(54) AUTOFOCUS CAMERA USING MEMS ACTUATION OF IMAGE SENSOR

(71) Applicants: Faez Ba-Tis, Toronto (CA); Ridha Ben-Mrad, Toronto (CA)

(72) Inventors: Faez Ba-Tis, Toronto (CA); Ridha Ben-Mrad, Toronto (CA)

(*) Notice: Subject to any disclaimer, the term of this patent is extended or adjusted under 35 U.S.C. 154(b) by 0 days.

This patent is subject to a terminal disclaimer.

(21) Appl. No.: 14/979,138

(22) Filed: Dec. 22, 2015

(65) Prior Publication Data

US 2017/0180619 A1    Jun. 22, 2017

(51) Int. Cl.
*H04N 5/232* (2006.01)
*H04N 5/225* (2006.01)

(52) U.S. Cl.
CPC ........... *H04N 5/232* (2013.01); *H04N 5/2253* (2013.01); *H04N 5/2254* (2013.01)

(58) Field of Classification Search
CPC ......... H04N 1/008; H04N 1/002; H04N 1/006
USPC ............... 348/357; 310/309, 300, 12.03
See application file for complete search history.

(56) References Cited

U.S. PATENT DOCUMENTS

| | | | | |
|---|---|---|---|---|
| 6,384,952 B1* | 5/2002 | Clark | ............... | G02B 26/06 359/200.6 |
| 8,269,395 B2* | 9/2012 | He | ............... | B81B 3/0062 310/308 |
| 9,306,475 B1* | 4/2016 | Ba-Tis | ............... | H02N 1/006 |
| 2001/0048265 A1* | 12/2001 | Miller | ............... | B81B 3/004 310/309 |
| 2013/0279030 A1* | 10/2013 | Calvet | ............... | H02N 1/008 359/823 |
| 2013/0314587 A1* | 11/2013 | Kriman | ............... | H02N 1/006 348/357 |
| 2014/0028897 A1* | 1/2014 | Azuma | ............... | G03B 13/36 348/357 |
| 2015/0350499 A1* | 12/2015 | Topliss | ............... | H04N 5/2253 348/373 |
| 2015/0350500 A1* | 12/2015 | Gutierrez | ............... | H04N 5/2253 348/374 |

\* cited by examiner

*Primary Examiner* — Antoinette Spinks
(74) *Attorney, Agent, or Firm* — Nasser Ashgriz; UIPatent Inc.

(57) ABSTRACT

A miniature camera module that achieves autofocus (AF) by applying actuation to the image sensor using MEMS (Micro Electro Mechanical System) actuators comprising of a piston-tube electrostatic actuators. The camera comprises of a MEMS piston-tube actuator, an image sensor die, an IC package, a housing, and a lens barrel. The image sensor die is attached and is electrically bonded to the moving rotor of the MEMS electrostatic piston-tube actuator, which is, in turn, attached and electrically bonded to a semiconductor device package. The packaged piston-tube actuator with the image sensor attached to it is covered with a transparent protection lid which could be an IR filter.

10 Claims, 12 Drawing Sheets

AUTOFOCUS CAMERA USING MEMS ACTUATION OF IMAGE SENSOR

FIELD OF THE INVENTION

The invention relates to the field of autofocus miniature cameras that utilize MEMS actuators to move an image sensor to achieve autofocus (AF). The present invention is used in a variety of electronic devices such as smartphones, iPads, laptops, and other electronic devices that require miniature camera modules for imaging.

BACKGROUND OF THE INVENTION

The traditional mechanism to achieve autofocus in miniature cameras, and all cameras in general, is based on translating the lens barrel along the optical axis (i.e. z axis) to continuously keep the projected image in focus at the image sensor plane. In such autofocus systems, an actuator is required to displace the lens barrel of typically more than 45 mg in mass a stroke of up to 100 microns or more depending on the optical design of the lenses. Different inventions present autofocus cameras using this type of lens barrel actuation mechanism. These include US patents No. U.S. Pat. Nos. 7,285,879 B2/ 7,880,982 B2/ 7,663,818 B2/ 7,586,702 B1/ 7,271,511 B2/ and a number of others. The lens barrel actuation-based autofocus mechanism has a number of drawbacks such as slow speed, large size modules, and optical lens tilt. The speed of the AF mechanism is usually compromised due to the large load of the whole barrel to be displaced by the actuator, i.e. >45 mg. Thus, the actuators used to displace lens barrels are often large in size in order to be able to handle the large weight of the barrel and also to accommodate the size of the lens barrel itself (i.e. lens barrels have a cylindrical shape with a diameter of about 5 mm and a height of almost 3.5 mm or more depending on the specific optical design of the lenses). Furthermore, mounting a lens barrel within the moving stage of the actuator typically introduces an undesired lens tilt of about 0.2° which results in a deterioration of the image quality.

To avoid such drawbacks, a novel mechanism to achieve autofocus in miniature cameras is disclosed in this invention. The new method suggests that the autofocus is achieved by translating the image sensor a stoke of up to 100 microns to keep the projected image on the image sensor plane. The required stroke here is still the same as the required stroke needed to achieve AF when the lens barrel actuation mechanism is used. In both cases, the relative distance between the lenses and the image sensor is to be varied. This method, based on moving the image sensor to achieve autofocus, was not pursued previously possibly due to the fact that there was no actuation technology that could handle the motion of the mass of an image sensor die, which is of the order of tens of milligrams and, at the same time, was compatible with image sensor electrical wiring and packaging. The invention described herein provides for a highly compact autofocus mechanism and the ability to translate the image sensor along the optical axis as well as rotate it along the two axis forming the plane perpendicular to the optical axis so as to correct for any lens tilt that occurs during assembly and/or during use of the camera such as any tilt due to shocks the camera module is subject to.

MEMS piston-tube electrostatic actuators that are developed by the applicants and described in patent application U.S. application Ser. No. 14/449,544 and PCT/IB2014/001498 are able to meet such requirements for autofocus using image sensor actuation.

SUMMARY OF THE INVENTION

The present invention discloses MEMS autofocus camera modules that achieve autofocus based on image sensor actuation using MEMS electrostatic piston-tube actuators, disclosed in U.S. patent application Ser. No. 14/449,544 and PCT/IB2014/001498, and incorporated by reference herein below. The actuator is able to translate an image sensor of several tens of milligrams in mass and a stroke of up to 100 microns. The actuator provides 3 degrees-of-freedom motion: translation along the optical axis (i.e. z axis) and bi-axial tilt about the in-plane x and y axes. The bi-axial tilt is used to cancel any undesired lens tilt due to imperfections in the lens barrel assembly and any tilt that occurs during the use of the camera module. The main features that enables the piston-tube actuator to meet the requirements of such autofocus mechanism (i.e. image sensor actuation) include the ability of bonding and packaging the MEMS silicon chips with the image sensors, the high reliability of the springs of the actuator based on the springs having a large width and a large height, the large length of the springs, and the ultra-thin height of the actuator.

The MEMS electrostatic actuators are made of semiconductors, commonly silicon, and, therefore, can easily be bonded and packaged with the image sensor die as the interconnections could be made using a standard interconnection technique such as wire bonding or flip-chip or any other interconnection technique. Current actuator technology used to achieve lens barrel motion based autofocus such as Voice Coil Motors (VCMs) are not compatible with semiconductor packaging, hence cannot be used to achieve image sensor actuation-based autofocusing.

A second feature that enables the MEMS piston-tube electrostatic actuators to achieve image sensor actuation-based autofocus is the structure of the springs of the actuators which allow transmitting the electrical signal via routings from the moving stage of the actuator to the outside circuit through these springs. The springs have a large width in the range of several tens of microns and a length in the range of several thousands of microns. This large width enables a large number of electrical signal routings to pass through. Image sensors vary in terms of the number of output pins they have but usually have more than 32 output signals, however, a MEMS piston-tube actuator has typically four springs, and each spring can carry tens of electrical signal routings. The large length of the springs of the actuators has also contributed to the ease of signal transmission as it reduces the stress on the electrical signal routings during tension and compression when the springs are in motion.

A third feature of the piston-tube electrostatic actuator is that it is thin in height as the standard height of the whole structure of the actuator can be as thin as 0.4 to 0.6 mm. This thin height enables the actuator to be placed beneath the image sensor without adding a considerable height to the thickness of the camera module. VCMs that are used in lens barrel actuation-based autofocus cameras usually contribute more to the height of the camera modules as they are large in size.

An electrical isolation and signal routing layers are added to the MEMS electrostatic piston-tube actuator, as disclosed in U.S. patent application Ser. No. 14/449,544 and PCT/IB2014/001498. These layers are deposited and patterned during the fabrication of the piston-tube actuator. The purpose of the isolation layer is to provide electrical separation between the different signal routings and the electrical pads of the actuator electrodes. The electrical signal routings transmit the output signals form the image sensor to the outside circuit through the mechanical springs; each said routing has two electrical pads; one of the electrical pads is placed on the moving rotor of the actuator and is electrically connected to the image sensor, and the other pad is placed on the stationary rotor-support-frame and is connected to the outside circuit.

The preferred embodiment of the camera module comprises a MEMS electrostatic piston-tube actuator, an image sensor die, an actuator package, a transparent protection lid, a housing, and a lens barrel. The image sensor die is attached to the rotor of the actuator and, then, bonded using wire bonding or flip-chip techniques or any other interconnection technique. The actuator with the image sensor being attached and bonded to it is attached to the actuator package which could be a standard image sensor package or any other chip carrier. The actuator is wire bonded to the package, which, in turn, is electrically bonded to the Printed Circuit Board (PCB). In other embodiments, the actuator could be directly bonded to the PCB without the need for the actuator package. The packaged image sensor-actuator module is covered with a transparent protective lid, which is made of glass or any other transparent material. This lid is used to protect the image sensor and works as a mechanical snubber for the actuator from the front side during any severe mechanical shocks that might occur such as during sudden drops (the stator plate of the actuator works as the mechanical snubber from the opposite side). The protection lid could work as an IR filter in the case that the lens barrel doesn't contain one. The covered and packaged image sensor-actuator module is attached to the back opening of the housing of the camera, and the lens barrel is attached to the front opening of the housing using a standard mechanical technique of attachment such as press-fitting or threading.

The camera achieves autofocus by translating the image sensor back and forth. When the object is at infinity, the actuator is at the rest position, and when the object is at close proximity, for example at 10 cm, the actuator is actuated to full stroke. Further enhancement of the image quality is achieved by 2 axis rotation of the image sensor along axes forming the plane perpendicular to the optical axis of the image sensor. The 2 axes rotation of the image sensor is used to compensate for any lens tilt that occurs during assembly and/or any tilt that arises during the use of the camera module.

It will be readily apparent to the one with ordinary skills in the art that parts of this camera module could be designed using other components and other configurations, and different techniques could be used for the assembly and attachment of these parts together without departure from the soul of the invention.

BRIEF DESCRIPTION OF DRAWINGS

Embodiments herein will hereinafter be described in conjunction with the appended drawings provided to illustrate and not to limit the scope of the claims, wherein like designations denote like elements, and in which:

DETAILED DESCRIPTION OF THE INVENTION

In one embodiment of the present invention, the image sensor actuation-based autofocus camera module comprises a MEMS electrostatic piston-tube actuator, an image sensor die, a package, a protective transparent lid, a housing, and a lens barrel.

Figure 1A:
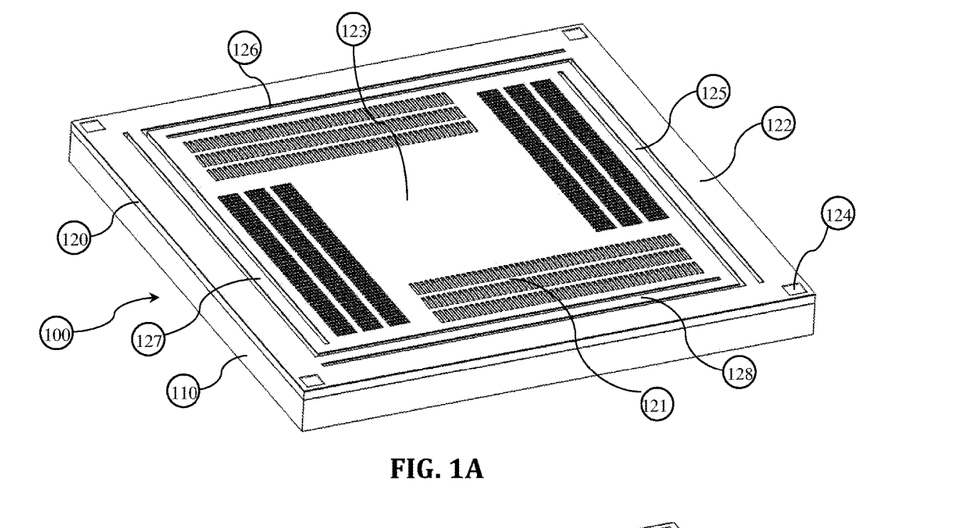
FIG. 1A shows a perspective view of a MEMS electrostatic piston-tube actuator used to achieve image sensor actuation-based autofocus, according to an example embodiment of the present invention.
Figure 1B:
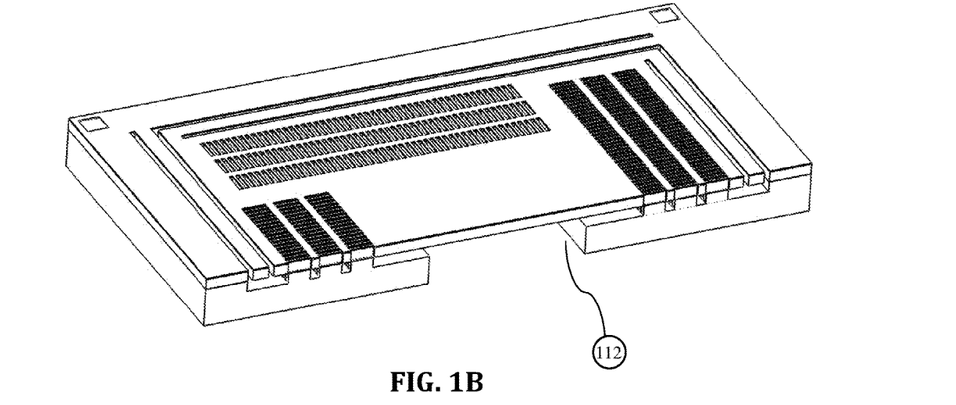
FIG. 1B shows a cross-sectional perspective view of a MEMS electrostatic piston-tube actuator used to achieve image sensor actuation-based autofocus, according to an example embodiment of the present invention.
Figure 2A:
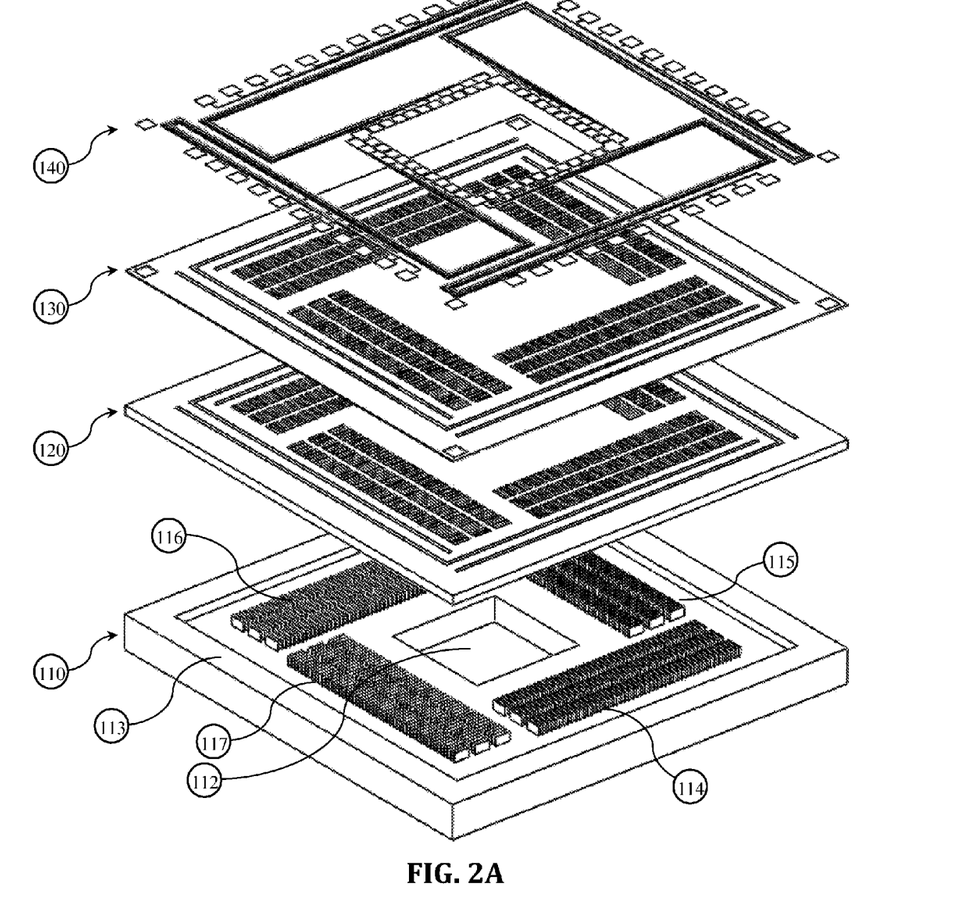
FIG. 2A is an exploded view of the final structure of the MEMS electrostatic piston-tube actuator when isolation and signal routing layers are added to the design of the actuator.

The MEMS piston-tube actuator 100, which is described in detail in the U.S. patent application Ser. No. 14/449544 and shown in FIG. 1A and FIG. 1B, has been designed to facilitate the attachment and electrical bonding of the image sensor die into it. As shown in FIG. 2A, the MEMS piston-tube actuator basically consists of a two-layer structure: a stator plate 110 and a rotor plate 120. The stator plate comprises of a stator-support-frame 113, multiple sub-arrays of pistons 114, 115, 116, 117 that could be electrically separated or connected, and/or a central through hole 112. The rotor plate consists of a rotor-support-frame 122 (see FIG. 1A) which is attached to the stator-support-frame 113; a moving rotor containing an actuator plate 123 and an array of open tubes 121; mechanical springs 125, 126, 127, 128 that hold the rotor; and electrical pads 124 used to connect the actuator electrodes to the outside circuit. The drawings of the piston-tube actuator cannot reflect the exact numbers of piston-tube pairs as they are usually in the range of several thousand pairs. These drawings are developed to represent such piston-tube pairs while keeping the drawings clear.

Figure 2B:
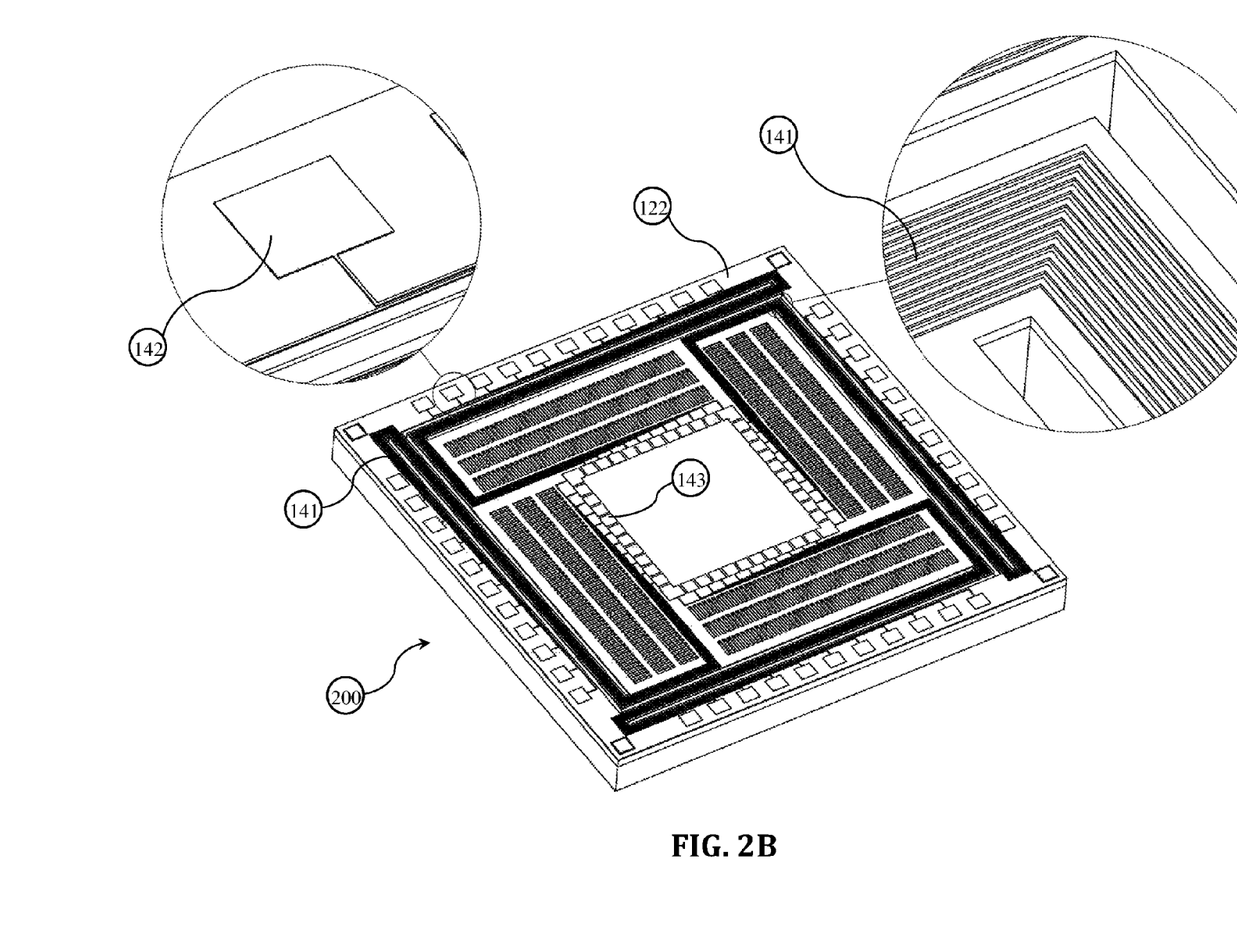
FIG. 2B illustrates perspective and detailed views showing the structure of the electrical signal routings on the rotor of the MEMS electrostatic piston-tube actuator used to achieve image sensor actuation-based autofocus, according to an example embodiment of the present invention.

An electrical insulation layer 130, shown in FIG. 2A, is deposited and patterned during the fabrication process of the actuator. This layer could be deposited on the entire top surface of the rotor plate except in areas where the electrical pads 124 of the actuator electrodes are located. The goal of adding such layer is to provide an electrical isolation between different signals routings that are used to transmit the signals from the image sensor die to the PCB through the actuator, and also to provide insulation between the actuator electrodes. In another embodiment, one may deposit this insulation layer only on the areas where the electrical signal routings are needed. A conductive (metal) layer 140 is also deposited and patterned during the fabrication on the rotor of the actuator above the insulating layer. Each signal routing consists of two electrical pads and a routing. The innermost electrical pad 143, shown in FIG. 2B, is on the moving rotor nearby the image sensor die that is attached to the rotor in a subsequent step, and the other pad 142 is on the stationary rotor-support-frame 122. The routing 141 connects these two pads 143 and 142. The number of the electrical signal routings is equal to the number of the output signals of the image sensor die. The large dimensions of the mechanical springs of the MEMS piston tube actuator enable the transmission of a large number of these signals without having a significant change on the stiffness of the springs as the thickness of such routing layer is in the range of several hundreds of nanometers as opposed to almost 100 um thickness of the springs. When electrostatic force is applied on the rotor, a tensile stress is induced on the upper half of the springs. This stress has its maximum value on the top surface of the springs at the fixed end (where the springs are connected to the stationary rotor-support-frame 122). This tensile stress takes on small values due to the large cross section of the springs. The routings are deposited on the top surface of the springs, hence they are subject to the same tensile stress that is acting on the top surface of the springs. The maximum values of the stress are significantly lower than the tensile yield strength of Silicon (which the springs are made of) and those of metals such as Gold (which the routings are usually made of), hence the routings are not subject to plastic deformations. Typical values of these various stresses and for typical size devices (e.g. an 9000× 9000 micrometers actuator) are maximum tensile stress of 40 MPa whereas the yield strength of Silicon is of the order of 7000 MPa (is also called fracture strength as Silicon yield by fracturing and doesn't undergo plastic deformation) and for metals such as Gold is of the order of 100 MPa. FIG. 2B illustrates the complete structure of the actuator 200 with insulation and electrical routings.

Figure 3A:
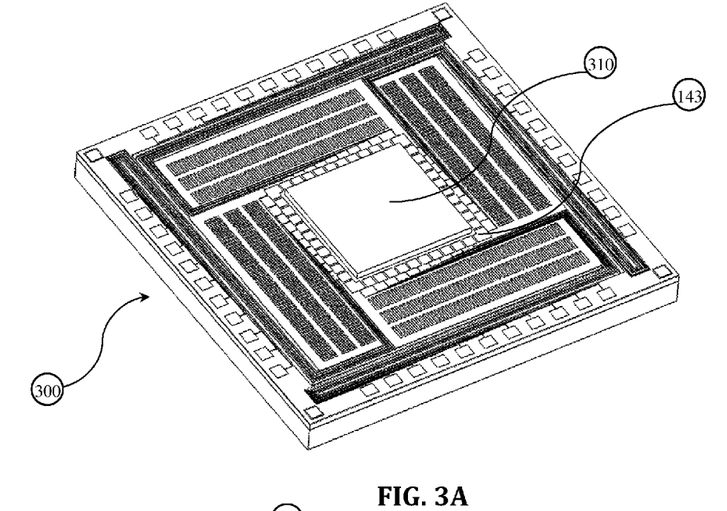
FIG. 3A shows a perspective view of the image sensor-actuator autofocus module, according to an example embodiment of the present invention.

An image sensor die 310 shown in FIG. 3A, which could be Chip-On-Board (COB) packaged, attached to the actuator plate and surrounded by the innermost electrical pads 143 of the electrical routings. The image sensor could be attached to the actuator plate using eutectic bonding or glued directly using an adhesive material. The image sensor die is then wire bonded to the innermost electrical pads of the signal routings, in all of the drawings of this invention disclosure the bonding wires are not shown to keep the clarity of the drawings. An assistive holder could be placed beneath the actuator inside the stator through hole 112 such that it keeps the rotor still and able to absorb pressure induced on the pads during wire bonding of the image sensor die. FIG. 3A shows the final structure of the image sensor-actuator autofocus module 300. In another embodiment of the invention, the through hole 112 hole might be removed when the spring mechanism of the rotor is stiff enough such that the springs are able to elastically deform and absorb the pressure of the wire bonding or the flip-chip bonding processes.

In another embodiment of the present invention, a Chip Scale Package (CSP) image sensor could be attached to the innermost electrical pads of the signal routings using a flip chip bonding technique. However, the innermost electrical pads of the signal routing have to be re-arranged according to the ball grid array of the CSP image sensor. It will be readily apparent to the one who is skilled in the art that other types of image sensors could be also mounted to the rotor, and the electrical pads of the signal routings could be arranged accordingly.

Figure 3B:
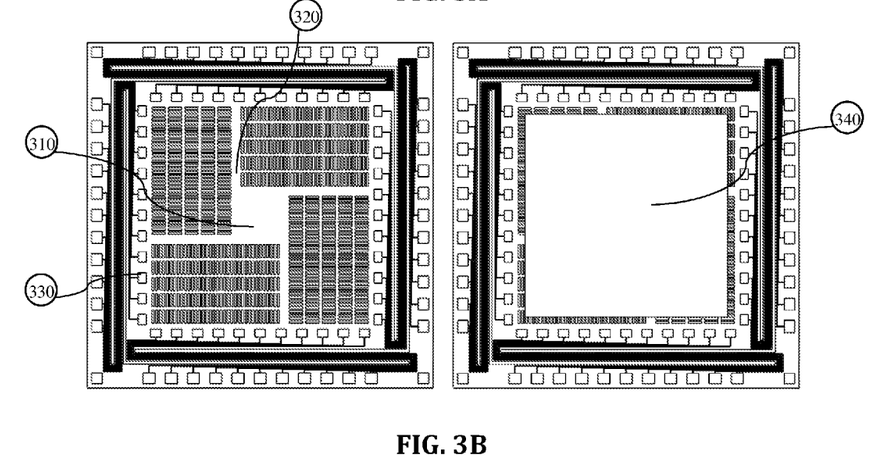
FIG. 3B illustrates top views of another configuration for attaching and bonding the image sensor into the rotor of a MEMS electrostatic piston-tube actuator, according to an example embodiment of the present invention.

In another embodiment of the present invention, the area of the actuator plate 123 beneath the image sensor could be also utilized for more arrays of pistons and tubes, as shown in FIG. 3B, which results in the generation of a larger electrostatic force; hence the size of the actuator can be reduced. A smaller actuator plate 310 and some lines 320 between the arrays of the tubes are left solid to help in the attachment of the image sensor 340 to the rotor. The innermost electrical pads of the signal routings 330 are relocated from the actuator plate to the outer periphery of the moving rotor as shown in FIG. 3B. The image sensor die 340 is then attached to the moving rotor and a number of the tubes are covered by the image sensor.

Figure 4:
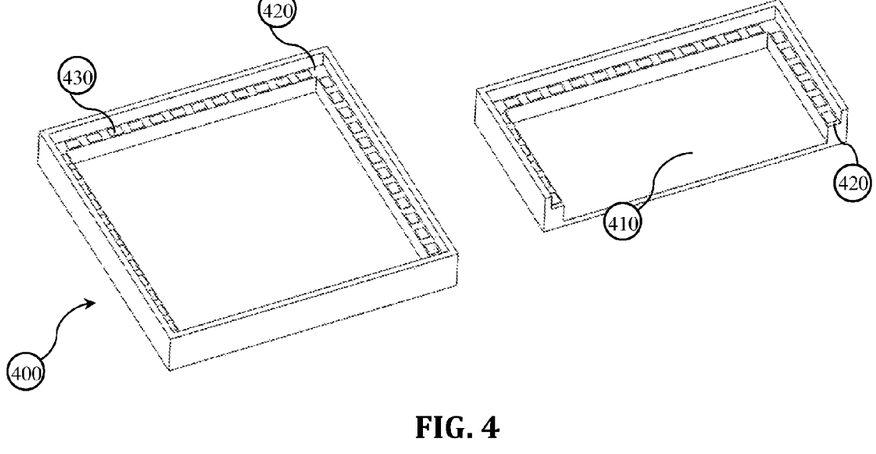
FIG. 4 is a perspective and a cross-sectional perspective views of the package of the image sensor-actuator autofocus module, according to an example embodiment of the present invention.

FIG. 4 shows the package of the image sensor-actuator autofocus module. This package could be of any of the standard packages of image sensors such as Leadless Chip Carrier (LCC) or any other IC package type. The package 400 might contain passive elements of the image sensor circuit or they might be outside the package connected to the PCB. The package consists of: a stepped square-shaped cavity that has a step surface 420, a bottom surface 410, electrical pads 430 which are placed on the said step surface 420, and second electrical pads of the package that might be located on the bottom surface of the package or on the sides of the package according to its type.

Figure 5:
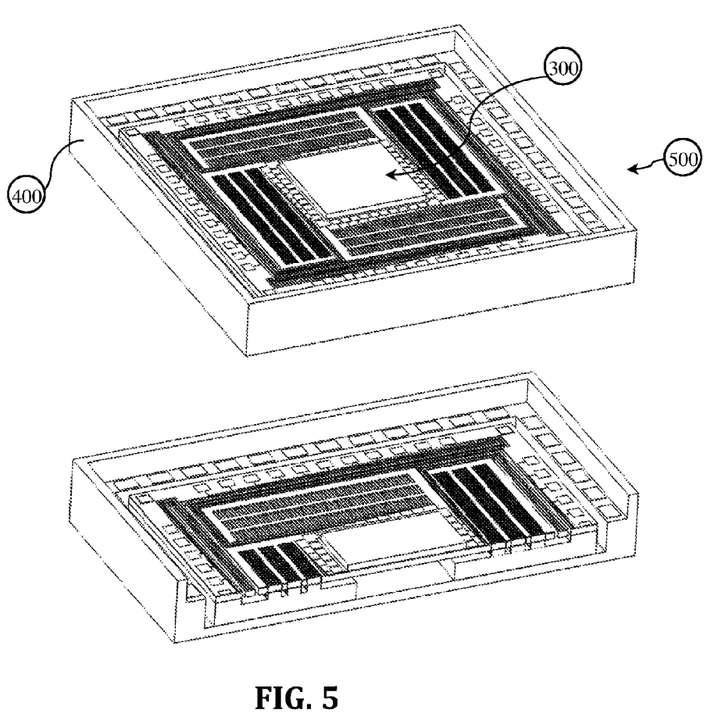
FIG. 5 is a perspective and cross-sectional perspective views of the packaged image sensor-actuator autofocus module, according to an example embodiment of the present invention.

The bottom side of the image sensor-actuator autofocus module is attached to the bottom surface 410 of the square-shaped cavity of the package using any of the attachment techniques. The second electrical pads of the signal routings 142 and actuator electrodes 124 are then wire bonded to the electrical pads 430 of the package 400. FIG. 5 shows the packaged image sensor-actuator autofocus module 500. In another embodiment of the present invention, the image sensor-actuator autofocus module 300 could be directly wire bonded to the PCB without the need for the package. In another embodiment of the present invention, the sensor is wire bonded directly to the pads of the package without the need for electrical routings through the actuator. However, noise might be introduced to the image sensor output signals as the image sensor is floating on the rotor and the wires are also moving accordingly. It might also cause the wires to break due the continuous movement of the wires.

Figure 6:
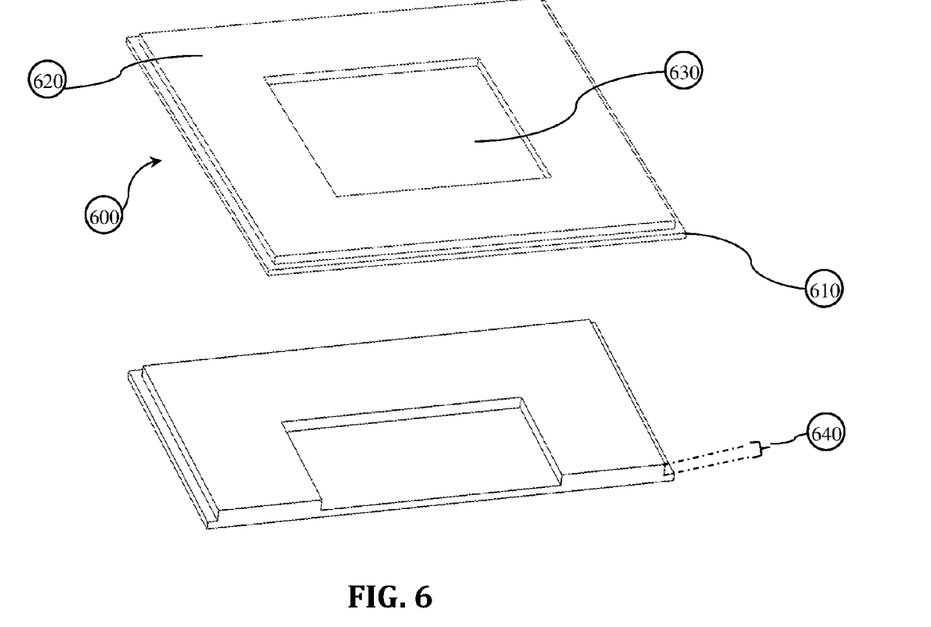
FIG. 6 is a perspective and a cross-sectional perspective views of the transparent protective lid for the package, according to an example embodiment of the present invention.
Figure 7A:
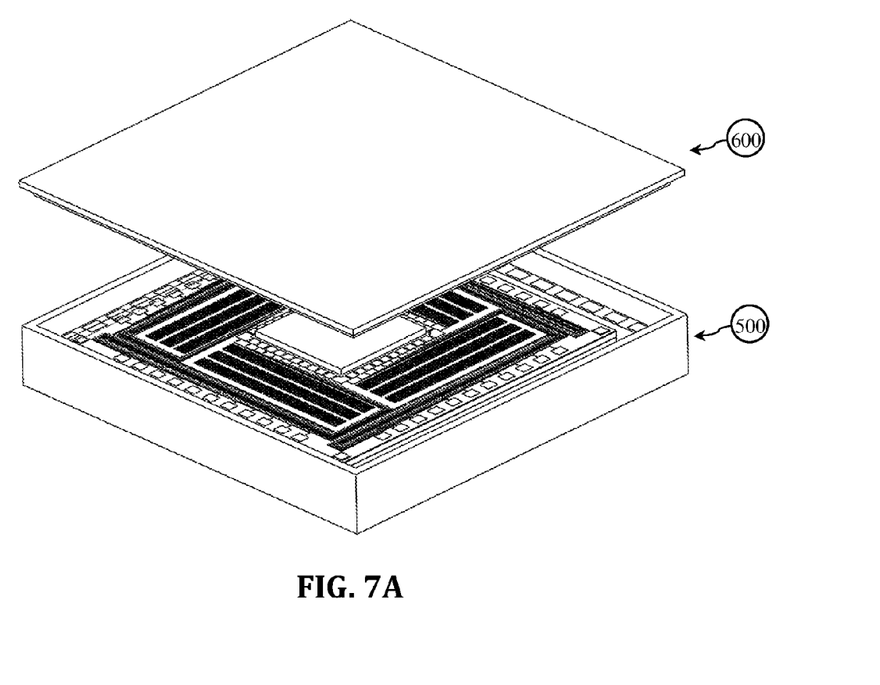
FIG. 7A is an exploded view showing the attachment of the transparent protective lid into the packaged image sensor-actuator autofocus module, according to an example embodiment of the present invention.
Figure 7B:
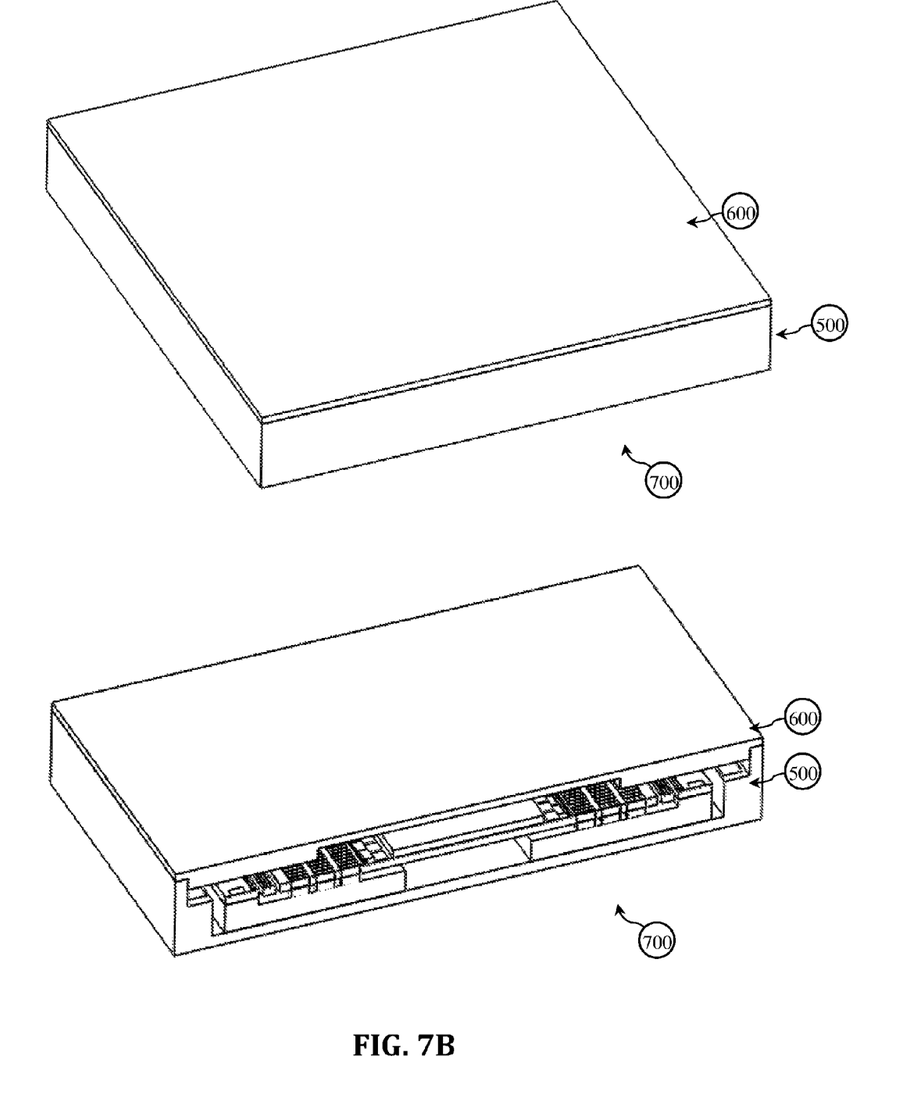
FIG. 7B is a perspective and a cross-sectional perspective views of the covered and packaged image sensor-actuator autofocus module, according to an example embodiment of the present invention.

A protective transparent lid is shown in FIG. 6. The lid could be made of any transparent material. It could be an IR filter in the case that the lens barrel doesn't contain one. It also works as a protective layer for the image sensor from dust and mechanical shocks and as mechanical snubber for the MEMS piston-tube actuator. The transparent lid 600 consists of a layer 610 of transparent material that has a squared protruding portion 620 that defines a squared cavity 630 at the center. The thickness 640 of the protruding portion is greater than the thickness of the image sensor such that the actuator rotor (tube areas and the outer periphery of the rotor where no image sensor covers them) touches the protruding portion of the lid before the image sensor touch the bottom of the said squared cavity 630 during severe mechanical shocks. That results in securing both the actuator and the image sensor from mechanical shocks. The outer periphery of the protruding portion is similar in size than the square-shaped cavity of the package 400 such they fit with each other. An adhesive might be used on the edges of the lid to enhance the attachment of the lid to the package. FIG. 7A shows the attachment of the lid 600 into the packaged image sensor-actuator autofocus module 500. FIG. 7B illustrates the covered and packaged image sensor-actuator autofocus module 700.

Figure 8:
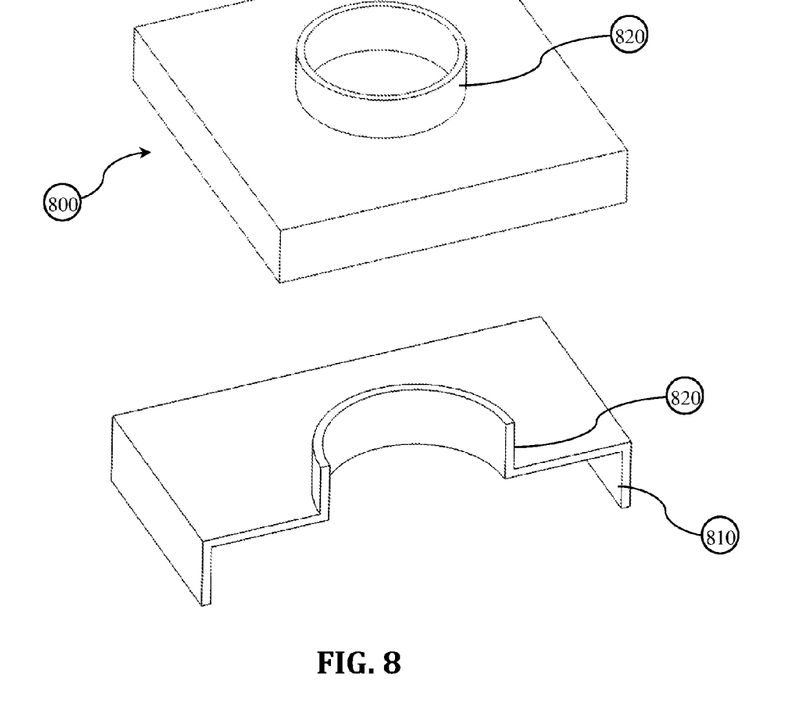
FIG. 8 is a perspective and a cross-sectional perspective views of the camera housing, according to an example embodiment of the present invention.

FIG. 8 shows the housing 800 of the camera module. The housing has two different openings: a square-shaped 810 and a circular one 820. The square-shaped opening 810 is sized to fit and receive the covered and packaged image sensor-actuator autofocus module 700 so that it is co-centric with the center of the image sensor. The circular opening is used as a lens barrel holder 820 and formed by an extended annular ring that is sized to fit and receive the lens barrel of the camera. The housing could be designed in various mechanical structures such that it fits into the covered and packaged image sensor-actuator autofocus module from one side and the lens barrel from the other side.

Figure 9:
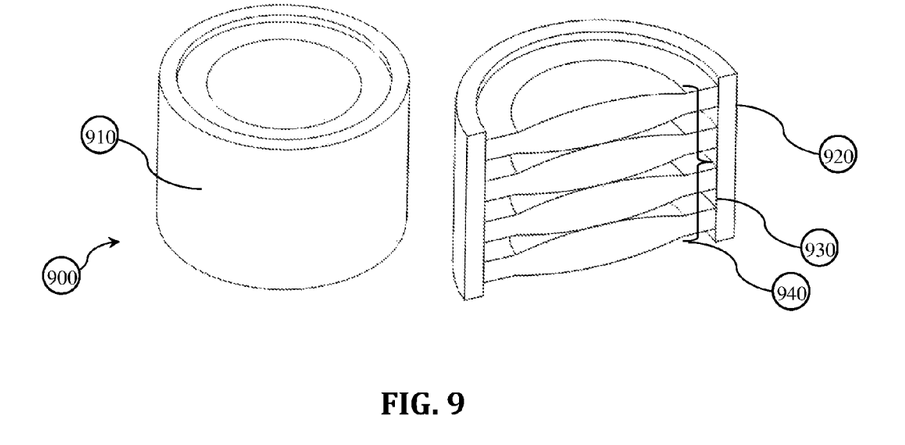
FIG. 9 is a perspective and a cross-sectional perspective views of the lens barrel containing the lenses of the image sensor actuation-based autofocus camera, according to an example embodiment of the present invention.
Figure 10:
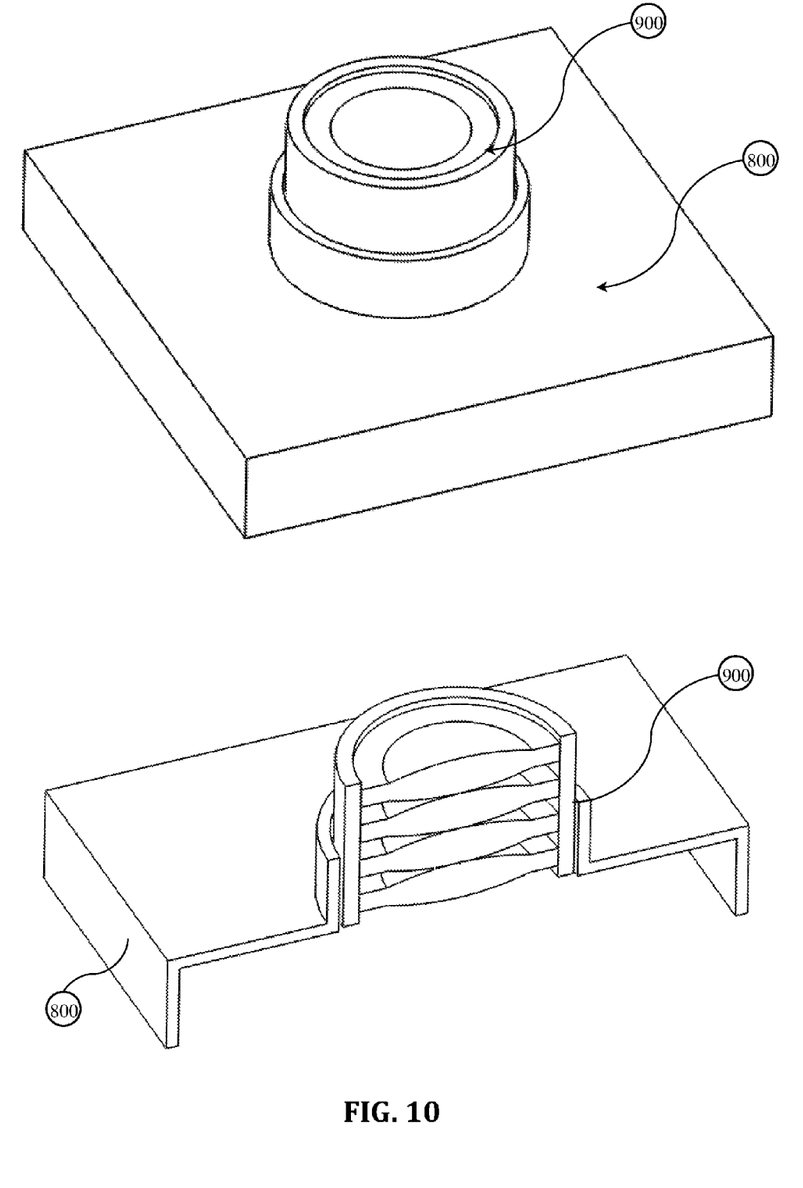
FIG. 10 is a perspective and a cross-sectional perspective views of the camera housing with the lens barrel attached to it, according to an example embodiment of the present invention.

The lens barrel 900, shown in FIG. 9, is an elongated annular tube 910 and contains the lens stack. It has an outer diameter 920 and an inner diameter 930 forming a through hole. The inner diameter of the lens barrel 930 may have a straight-barrel design or a stepped barrel design, and the lenses 940 are mounted according to each design and they are co-centric with respect to the barrel. The drawings of the lenses 940 are merely illustrations to indicate the existence of a number of lenses inside the lens barrel; they do not represent the actual design and number of lenses. The lenses could have any optical design; the lens barrel may contain a single lens or two or three or five or more lenses. An IR filter may be included inside the barrel, or it could outside the barrel attached to the image-sensor actuator autofocus module. The outer diameter 920 of the barrel is almost equal to the diameter of the lens barrel holder 820 of the housing to ensure that the lenses are centered with respect to the center of the image sensor. The lens barrel 900 is then attached to the lens barrel holder part of the housing 800 as shown in FIG. 10 using a mechanical attachment technique such press-fitting, thread-fitting, or using a glue or any other attachment technique.

Figure 11:
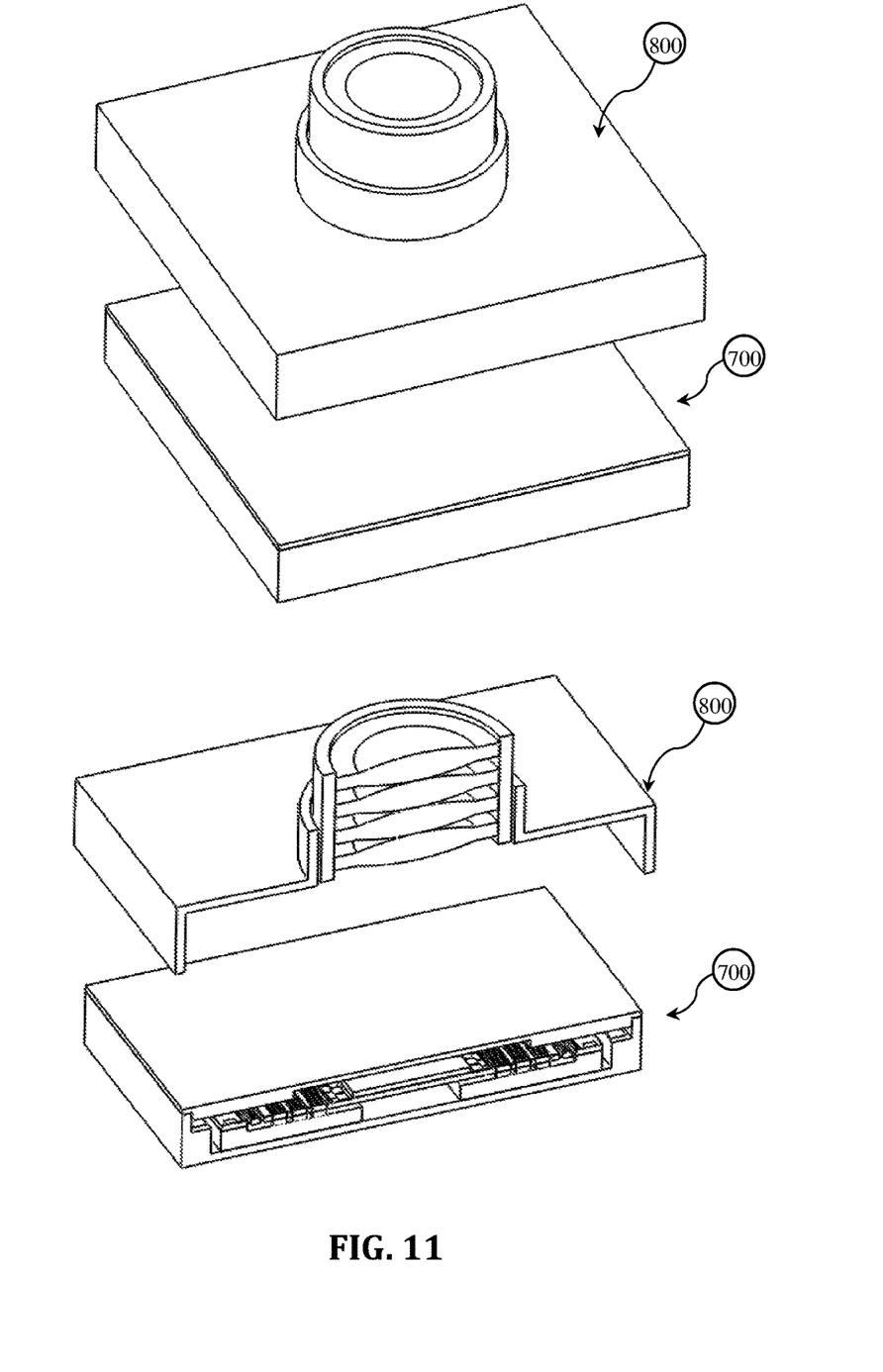
FIG. 11 is an exploded view showing the attachment of the camera housing holding the lens barrel into the covered and packaged image sensor-actuator autofocus module, according to an example embodiment of the present invention.

The housing with a lens barrel attached to it is then attached to the covered and packaged image sensor-actuator autofocus module 700 as shown in FIG. 11. Another way of assembly, the housing 400 is first attached to the covered and packaged image sensor-actuator autofocus module 700, and then the lens barrel is attached to the housing.

Figure 12:
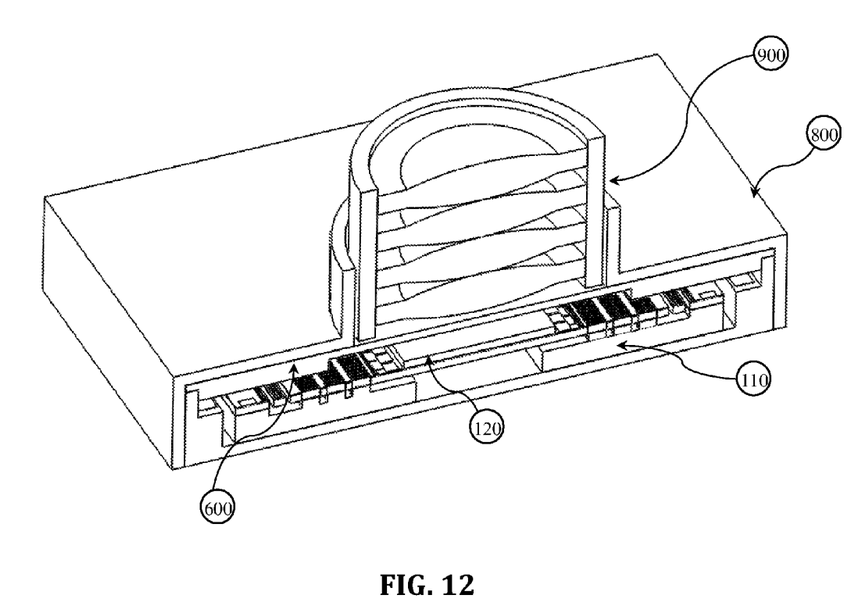
FIG. 12 is a cross-sectional perspective view of the final assembly of the image sensor actuation-based autofocus camera, according to an example embodiment of the present invention.
Figure 13:
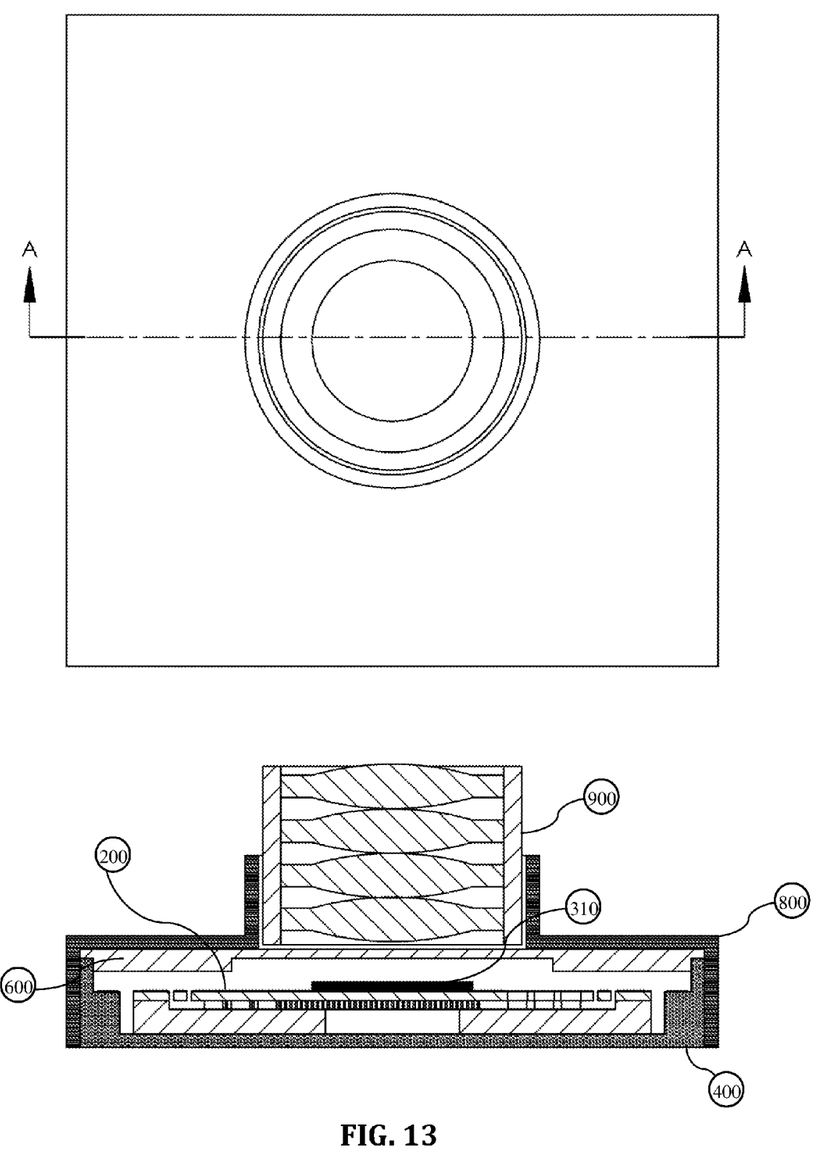
FIG. 13 is a front and a cross-sectional views of the final assembly of the image sensor actuation-based autofocus camera module, according to an example embodiment of the present invention.

FIGS. 12-13 show the complete assembly of the image sensor-based autofocus camera module.

It will be readily apparent to the one with ordinary skill in the art that the camera module parts could be designed and assembled in various other ways without departure from the soul of the present invention.

The foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

With respect to the above description, it is to be realized that the optimum relationships for the parts of the invention in regard to size, shape, form, materials, function and manner of operation, assembly and use are deemed readily apparent and obvious to those skilled in the art, and all equivalent relationships to those illustrated in the drawings and described in the specification are intended to be encompassed by the present invention.

What is claimed is:

1. A camera module, comprising:
   a. a MEMS electrostatic piston-tube actuator comprising:
      i. a stator plate having multiple subarrays of pistons extending outwardly and perpendicular to said stator plate, wherein the pistons in each subarray of pistons being electrically connected to each other, and the pistons in each subarray of pistons being electrically insulated from the pistons in other subarrays of pistons, and wherein each subarray of pistons being electrically addressable;
      ii. a rotor plate having a—actuator-plate and an array of spaced apart through apertures or tubes surrounding said actuator-plate fabricated in the rotor plate, wherein said apertures being vertically aligned with said pistons, and wherein each said aperture having an aperture opening sized and shaped to receive and interdigitate with each said piston without the piston-walls touching the walls of said aperture during a rotation, and the walls of said apertures being electrically connected to each other,
      iii. a plurality of mechanical springs connecting said array of apertures to a non-moving frame, wherein during an actuation in response to electrostatic forces from a drive voltage applied between one or more subarrays of pistons and the rotor plate, the rotor translates and tilts in a defined direction;
   b. an image sensor attached to said rotor, wherein said MEMS electrostatic piston-tube actuator actuates said image sensor along said optical axis to achieve autofocus in the camera module, and enables compensation of any lens tilt by rotating or tilting the sensor along the two axis forming the plane perpendicular to the optical axis;
   c. a signal routings that transmit the output signals from the image sensor to the outside circuit through the mechanical springs;

d. a lens barrel containing optical lenses having an optical axis; and e. a housing that is sized to fit and receive said MEMS actuator containing, attached said image sensor and said lens barrel.

2. The camera module of claim 1, wherein each said routing has two electrical pads; one of the electrical pads is placed on the moving rotor of the actuator and is electrically connected to the image sensor, and the other pad is placed on the stationary rotor-support-frame and is connected to the outside circuit.

3. The camera module of claim 1, wherein said MEMS electrostatic piston-tube actuator contains an insulating layer to provide electrical isolation between different said electrical routings and the actuator electrodes.

4. The camera module of claim 1, wherein said MEMS electrostatic piston-tube actuator with said image sensor integrated into it is attached and electrically bonded to an IC package to facilitate the electrical connections to the driving circuit.

5. The camera module of claim 4, wherein a transparent lid is attached to said package to protect the image sensor from dust and mechanical shocks.

6. The camera module of claim 5, wherein the transparent lid being a mechanical snubber for moving the rotor of the actuator to protect the actuator from severe mechanical shocks.

7. The camera module of claim 1, wherein said image sensor is a COB or SCP packaged image sensor.

8. The camera module of claim 1, wherein said image sensor is directly and electrically bonded to the outside circuit without the need to electrical routings on the actuator rotor plate.

9. The camera module of claim 1, wherein said image sensor is directly electrically bonded to an IC package pads without the need to the electrical routings on the actuator rotor plate.

10. The camera module of claim 1, wherein the lens barrel further contains an IR filter.

* * * * *